US009607748B2

(12) United States Patent
Mihailovich et al.

(10) Patent No.: US 9,607,748 B2
(45) Date of Patent: Mar. 28, 2017

(54) MICRO-FABRICATED INTEGRATED COIL AND MAGNETIC CIRCUIT AND METHOD OF MANUFACTURING THEREOF

(71) Applicant: Teledyne Scientific & Imaging, LLC, Thousand Oaks, CA (US)

(72) Inventors: Robert E. Mihailovich, Newbury Park, CA (US); Alex P. Papavasiliou, Thousand Oaks, CA (US); Vivek Mehrotra, Simi Valley, CA (US); Philip A. Stupar, Oxnard, CA (US); Robert L. Borwick, III, Thousand Oaks, CA (US); Rahul Ganguli, Oak Park, CA (US); Jeffrey F. DeNatale, Thousand Oaks, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 77 days.

(21) Appl. No.: 14/476,644

(22) Filed: Sep. 3, 2014

(65) Prior Publication Data
US 2016/0064470 A1   Mar. 3, 2016

(51) Int. Cl.
*H01L 23/00* (2006.01)
*H01F 17/00* (2006.01)
*H01L 49/02* (2006.01)

(52) U.S. Cl.
CPC ......... *H01F 17/0013* (2013.01); *H01L 23/00* (2013.01); *H01F 2017/0066* (2013.01); *H01F 2017/0086* (2013.01); *H01L 28/10* (2013.01)

(58) Field of Classification Search
None
See application file for complete search history.

(56) References Cited

U.S. PATENT DOCUMENTS 5,070,317 A    12/1991  Bhagat
6,002,161 A *  12/1999  Yamazaki ............. H01L 23/645
                                                          257/531

(Continued)

FOREIGN PATENT DOCUMENTS

WO         02/095775         11/2002

OTHER PUBLICATIONS

Wang, Mingliang et al., "Design and Fabrication of Integrated Power Inductor Based on Silicon Molding Technology", IEEE, 1-4244-0655-2/07, 2007, pp. 1612-1618.

(Continued)

*Primary Examiner* — Abul Kalam
(74) *Attorney, Agent, or Firm* — Snell & Wilmer LLP

(57) ABSTRACT

A micro-fabricated electromagnetic device is provided for on-circuit integration. The electromagnetic device includes a core. The core has a plurality of electrically insulating layers positioned alternatingly between a plurality of magnetic layers to collectively form a continuous laminate having alternating magnetic and electrically insulating layers. The electromagnetic device includes a coil embedded in openings of the semiconductor substrate. An insulating material is positioned in the cavity and between the coil and an inner surface of the core. A method of manufacturing the electromagnetic device includes providing a semiconductor substrate having openings formed therein. Windings of a coil are electroplated and embedded in the openings. The insulating material is coated on or around an exposed surface of the coil. Alternating magnetic layers and electrically insulating layers may be micro-fabricated and electroplated as a single and substantially continuous segment on or around the insulating material.

16 Claims, 8 Drawing Sheets

(56) References Cited

U.S. PATENT DOCUMENTS

| | | | |
|---|---|---|---|
| 6,233,834 B1 | 5/2001 | Walsh | |
| 6,287,931 B1* | 9/2001 | Chen | H01L 21/76224 257/E21.022 |
| 7,791,440 B2 | 9/2010 | Ramadan et al. | |
| 8,072,042 B1* | 12/2011 | Kroener | H01F 41/046 257/531 |
| 8,470,612 B2* | 6/2013 | Hofmann | H01F 41/046 257/531 |
| 8,552,708 B2 | 10/2013 | de Rochemont | |
| 2003/0080845 A1* | 5/2003 | Fontanella | H01F 17/0006 336/200 |
| 2009/0039999 A1* | 2/2009 | Fujii | H01F 17/0006 336/200 |
| 2011/0018136 A1 | 1/2011 | Bedair et al. | |
| 2012/0068301 A1* | 3/2012 | Sin | H01L 23/645 257/531 |
| 2013/0260483 A1* | 10/2013 | Hofmann | H01F 41/046 438/3 |
| 2013/0321094 A1* | 12/2013 | Sumida | H01L 23/481 333/24.2 |
| 2014/0197904 A1 | 7/2014 | Brown et al. | |
| 2014/0203399 A1* | 7/2014 | Hofmann | H01F 41/046 257/531 |

OTHER PUBLICATIONS

Deleage, Olivier et al., Design and Realization of Highly Integrated Isolated DC/DC Microconverter, IEEE Transactions on Industry Applications, vol. 47, No. 2, Mar./Apr. 2011, pp. 930-938.

Gardner, Donald S. et al., "Integrated Inductors with Magnetic Materials for On-Chip Power Conversion", Intel Corporation; 35 pages.

Laur, Jean-Pierre et al., "Spiral Type Micro-Inductor with CoNiFe Core for Integrated DC/DC Converters", Laboratoire d'Analyse et d'Architecture des Systeme du CNRS, Toulouse, France, 1 page.

* cited by examiner

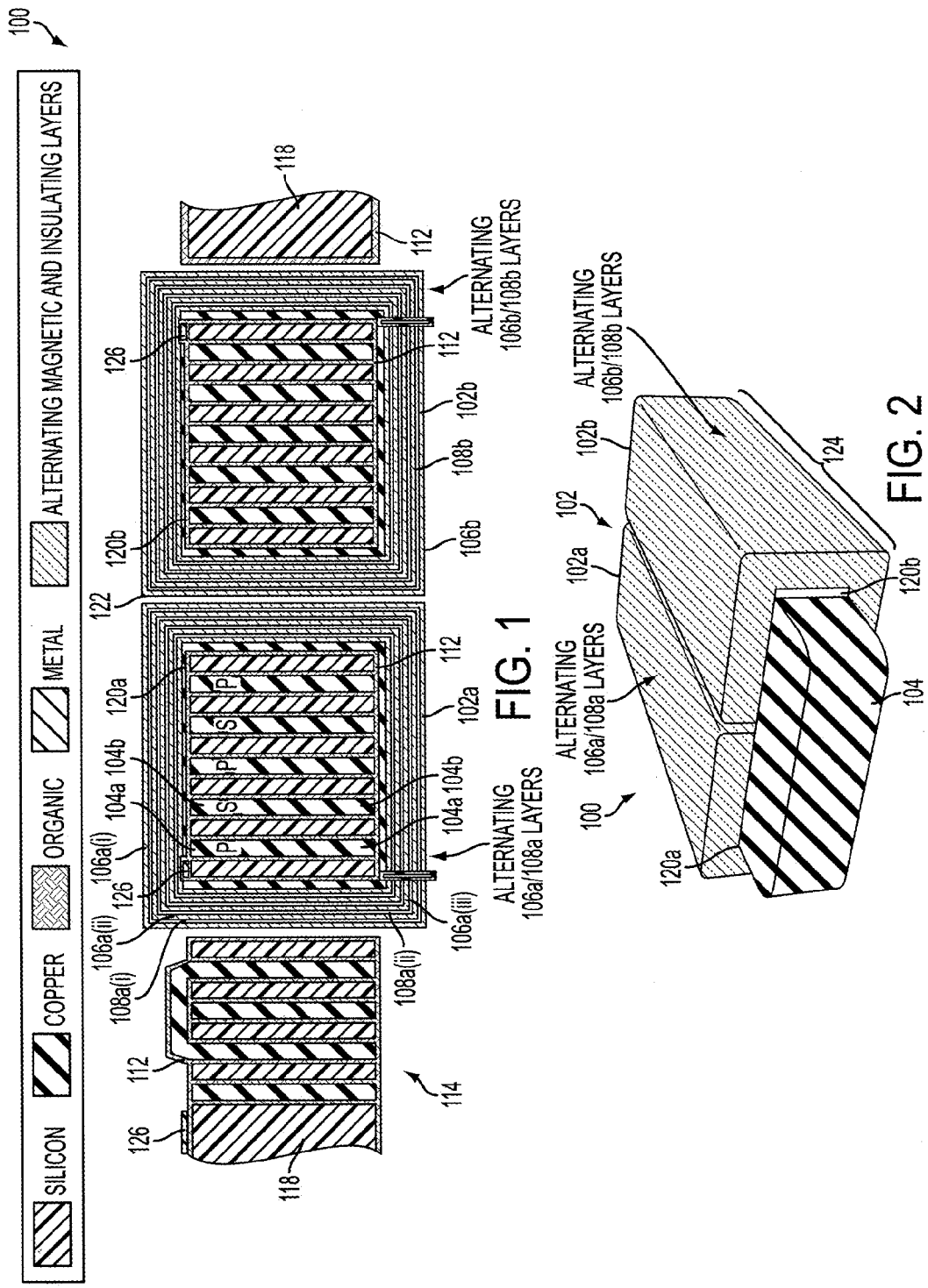

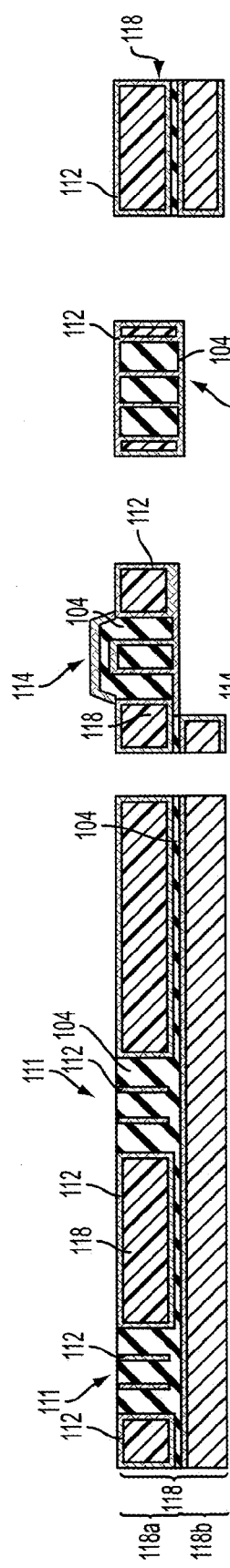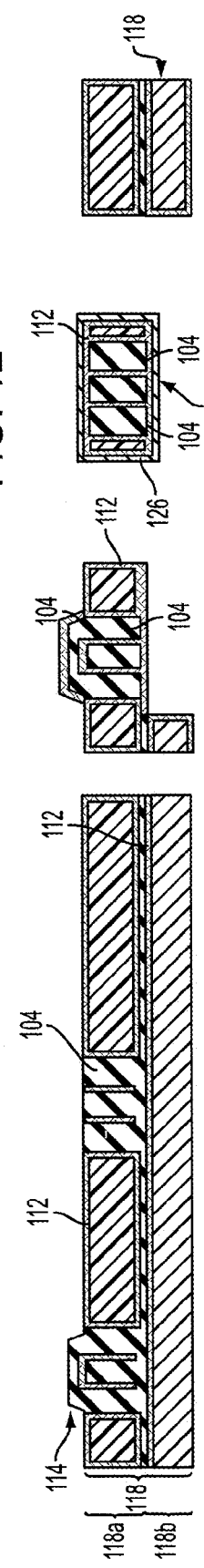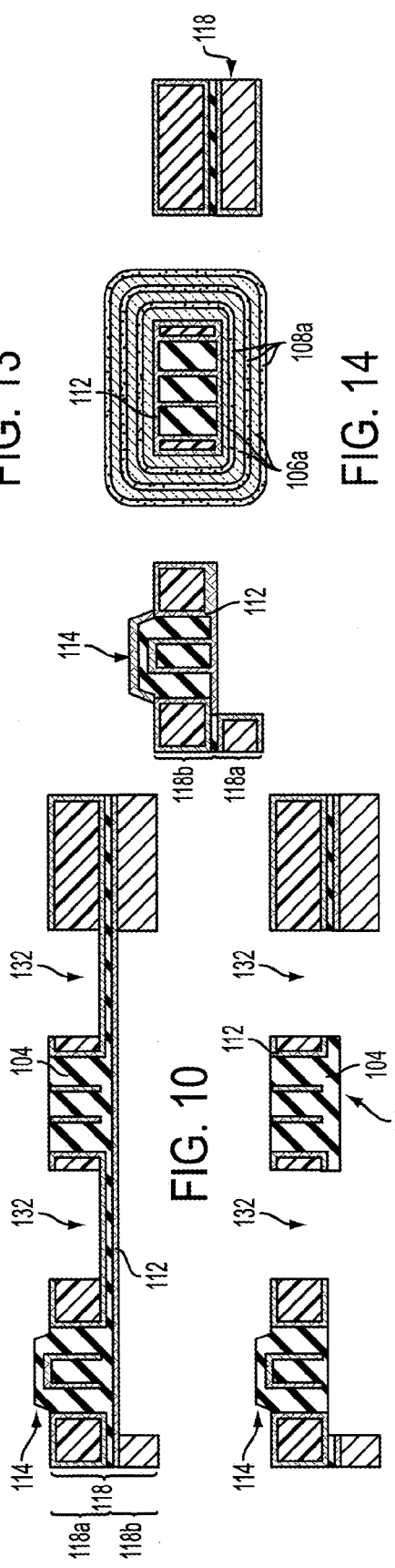

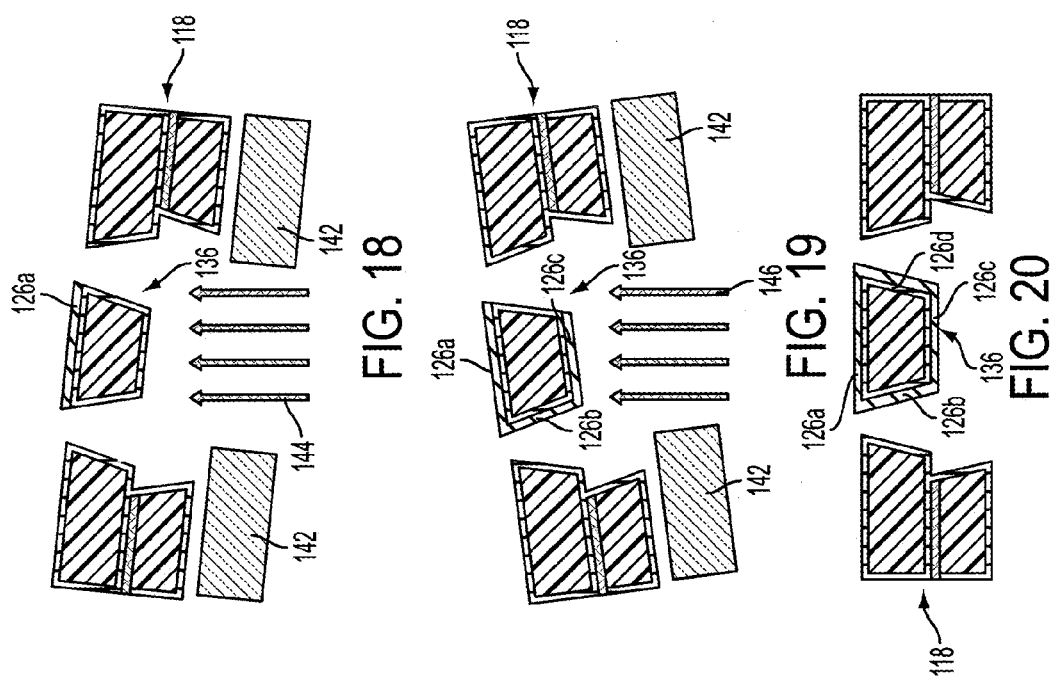

MICRO-FABRICATED INTEGRATED COIL AND MAGNETIC CIRCUIT AND METHOD OF MANUFACTURING THEREOF

STATEMENT REGARDING GOVERNMENT RIGHTS

This invention was made with Government support under Government Contract Reference No. DE-AR0000113 awarded by Advanced Research Projects Agency—Energy of U.S. Department of Energy. The Government has certain rights in this invention.

BACKGROUND

Field

The present disclosure relates to integrated and micro-fabricated magnetic circuits and methods of manufacturing thereof.

Description of the Related Art

Electromagnetic devices, such as inductors, transformers, and various other electromagnetic devices, utilize coils that pass through a cavity of a magnetic core. Conventional fabrication processes of such electromagnetic elements have been limiting in terms of size and density. Because cores known in the art have been commonly manufactured with multiple low-frequency magnetic components, power loss and parasitics are significant. Furthermore, micro-scale cores known in the art that provide closed magnetic flux path have structural discontinuities that impact flux loss. The micro-scale cores known in the art are also susceptible to flux bunching and spreading.

Micro-scale magnetic elements known in the art do not perform optimally under high frequencies and are therefore unsuitable for integration in power converter circuits (e.g., DC-DC converters). Furthermore, micro-scale magnetic elements have poor transient responses. The poor transient response is unsuitable for integration in power amplifiers of envelope tracking circuitry in which bias voltage is dynamically adjusted at a high frequency.

Therefore, there is a need in the art for micro-scale electromagnetic elements to provide a closed loop magnetic flux and significantly suppress or eliminate power loss. Furthermore, there is a need for a low-cost method of manufacturing and on-chip integration of micro-scale electromagnetic elements. In addition, there is a need in the art for micro-fabricated electromagnetic elements that perform optimally at high frequencies with a favorable transient response.

SUMMARY

The present invention is an electromagnetic device that includes a core having a width and a length along a longitudinal axis substantially greater than the width. The core defines a cavity along the longitudinal axis. The core includes a first magnetic layer and a second magnetic layer positioned substantially parallel to the first magnetic layer. The core also includes an electrically insulating layer positioned between the first magnetic layer and the second magnetic layer. The electrically insulating layer suppresses eddy currents flowing between the first magnetic layer and the second magnetic layer. Each of the first magnetic layer and the second magnetic layer is formed as a single and substantially continuous segment for providing a continuous closed-loop magnetic flux substantially free of bunching and spreading. A semiconductor substrate is positioned at least partially in the cavity and has a plurality of openings formed therein. The openings can have a high aspect ratio to be tall, thin and long. A coil made of an electrically conductive material is positioned or embedded in the plurality of openings of the semiconductor substrate. The coil has a portion substantially parallel to the longitudinal axis. Another core may be structured similarly to the core described above. The coil may have a plurality of interleaved primary and secondary windings passing through cavities of both cores.

The core and the coil may be micro-fabricated for integration in an electronic circuit. Micro-fabrication advantageously provides a compact structure and enhances power density. Each of the first magnetic layer and the second magnetic layer of the core is electroplated as a single conformal or continuous segment around the coil for providing a continuous closed-loop magnetic flux substantially free of bunching and spreading. The magnetic layers of the core may be made of a first material having high magnetic permeability and low magnetic coercivity, such as CoNiFe. The electrically insulating layer of the core may be made of a material capable of enhancing magnetic characteristics of the core and electrically insulating the magnetic layers from one another to reduce eddy currents and power loss. The electrically insulating layer may be made of a Ferrite material.

An insulating material may be positioned in the plurality of openings and between the substrate and the coil. The insulating material insulates the coil from the substrate and reduces stress from a thermal expansion mismatch between the coil and the substrate. The insulating material may be made of at least an organic material capable of deformation such as Parylene.

The present invention relates to a micro-fabricated electromagnetic device integrated in an electronic circuit. The electromagnetic device includes a core having a width and a length along a longitudinal axis that is substantially greater than the width. The core defines a cavity along the longitudinal axis. A plurality of magnetic layers extend parallel to the longitudinal axis and surround the cavity. Each of the plurality of magnetic layers is formed as a single and substantially continuous segment for providing a continuous closed-loop magnetic flux substantially free of bunching and spreading. A plurality of electrically insulating layers are positioned alternatingly between the plurality of magnetic layers to collectively form a continuous laminate. The core has alternating magnetic and electrically insulating layers. The electrically insulating layers suppress a current flowing between the plurality of magnetic layers. The electromagnetic device further includes a semiconductor substrate positioned at least partially in the cavity and having a plurality of openings. A coil formed of an electrically conductive material is embedded in the plurality of openings of the semiconductor substrate. The coil has a portion substantially parallel to the longitudinal axis and positioned in the cavity. An insulating material is positioned in the cavity and between the coil and an inner surface of the core. The insulating material electrically insulates the core from the coil and reduces stress from a thermal expansion mismatch between the coil and the core.

The present invention further provides a method of manufacturing an electromagnetic device set forth above. The method includes etching a first plurality of openings in a semiconductor substrate, for example, using deep reactive ion etching. An insulating material is deposited or coated on a first plurality of exposed surfaces of the semiconductor substrate. Windings of a coil made of an electrically conductive material are positioned or embedded in the first plurality of openings of the semiconductor substrate. The insulating material is positioned between the semiconductor substrate and the coil. The positioning or embedding the windings of the coil may include plating (e.g., electroplating) the windings of the coil in the plurality of openings of the semiconductor substrate.

A second plurality of openings are formed in the semiconductor substrate. The second plurality of openings can be formed using deep reactive ion etching along with wet and dry etching. The second plurality of openings provide space for forming a magnetic core. Additional insulating material are deposited or coated on a second plurality of exposed surfaces of the coil and a second plurality of exposed surfaces of the semiconductor substrate. A metal seed layer is deposited on the additional insulating material. The deposition of the metal seed layer may include front-side metallization using a vapor deposition process and at least one back-side metallization in order to encompass the additional insulating material. Alternating magnetic layers and electrically insulating layers are plated as a single and substantially continuous segment in the second plurality of openings and on the metal seed layer.

The foregoing electromagnetic device is micro-fabricated, formed by continuous, single-segment plating, and integrated on a chip. As a result, the foregoing electromagnetic device structure advantageously provides a closed loop flux path substantially free of bunching and spreading. The foregoing electromagnetic device structure also advantageously provides high power density, high efficiency, and favorable transient response.

BRIEF DESCRIPTION OF THE DRAWINGS

Other systems, methods, features, and advantages of the present disclosure will be or will become apparent to one with skill in the art upon examination of the following figures and detailed description. It is intended that all such additional systems, methods, features, and advantages be included within this description, be within the scope of the present disclosure, and be protected by the accompanying claims. Component parts shown in the drawings are not necessarily to scale, and may be exaggerated to better illustrate the important features of the present disclosure. In the drawings, like reference numerals designate like parts throughout the different views, wherein:

FIG. 1 is a cross-section schematic view of an electromagnetic device having two magnetic cores and a coil embedded in a substrate according to an embodiment of the present invention;

FIG. 2 is a perspective schematic view of the electromagnetic device shown in FIG. 1 according to an embodiment of the present invention;

FIG. 8 is a cross-section schematic view of a coil embedded in a semiconductor substrate according to an embodiment of the present invention;

FIG. 9 is a cross-section schematic view of out-of-plane crossover connections added to the embodiment shown in FIG. 8 according to an embodiment of the present invention;

FIG. 10 is a cross-section schematic view of partial formation of a second plurality of openings in the semiconductor substrate of FIG. 9 in order to provide space for forming a magnetic core according to an embodiment of the present invention;

FIG. 11 is a cross-section schematic view of complete formation of a second plurality of openings in the semiconductor substrate of FIG. 9, thereby forming a middle isolated portion according to an embodiment of the present invention;

FIG. 12 is a cross-section schematic view of additional insulating material formed around the middle isolated portion of FIG. 11 according to an embodiment of the present invention;

FIG. 13 is a cross-section schematic view of a metal seed layer formed around the additional insulating material surrounding the middle isolation portion of FIG. 12 according to an embodiment of the present invention;

FIG. 14 is a cross-section schematic view of a plurality of continuous magnetic and electrically insulating layers plated around the metal seed layer of FIG. 13 according to an embodiment of the present invention;

FIG. 15 is a cross-section schematic view of a semiconductor substrate having a middle isolated portion covered with an insulating material and a coil embedded therein according to an embodiment of the present invention;

FIG. 16 is a cross-section schematic view of front-side metallization process for formation of a front-side metal seed layer on at least the front side of the middle isolated portion according to an embodiment of the present invention;

FIG. 17 shows a middle isolated portion of the semiconductor substrate having a front side covered with a front-side metal seed layer as a result of the front-side metallization process of FIG. 16 according to an embodiment of the present invention;

FIG. 18 is a cross-section schematic view of a first back-side metallization process according to an embodiment of the present invention;

FIG. 19 is a cross-section schematic view of a second back-side metallization process according to an embodiment of the present invention;

FIG. 20 is a cross-section schematic view of a metal seed layer formed after performing the front-side and back-side metallization processes of FIGS. 16, 18, and 19 according to various embodiments of the present invention;

DETAILED DESCRIPTION

Figure 3A:
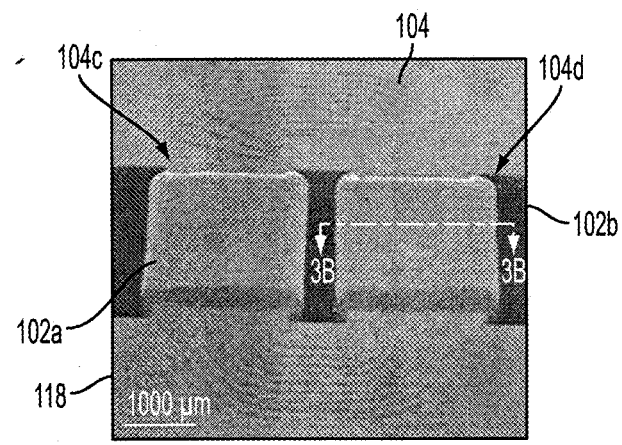
FIG. 3A is a scanning electron microscope (SEM) top-view image of a coil passing through cavities of two cores according to an embodiment of the present invention.

Apparatus, systems and methods that implement the implementation of the various features of the present disclosure will now be described with reference to the drawings. The drawings and the associated descriptions are provided to illustrate some implementations of the present disclosure and not to limit the scope of the present disclosure. Throughout the drawings, reference numbers are re-used to indicate correspondence between reference elements. In addition, the first digit of each reference number generally indicates the figure in which the element first appears.

FIG. 1 is a cross-section schematic view of an electromagnetic device 100 having a core unit 102 and a coil 104 embedded in a semiconductor substrate 118. FIG. 2 is a perspective schematic view of the electromagnetic device 100 shown in FIG. 1. The electromagnetic device 100 may be a transformer or a portion thereof. The electromagnetic device 100 may have a core unit 102 which may include a first core 102a and a second core 102b. The cores 102a and 102b may optionally be separated by a gap 122. Hereinafter, structure and characteristics of the first core 102a will be described. The second core 102b may have the same or similar structure and characteristics set forth below with respect to the first core 102a.

The first core 102a has a width and a length along a longitudinal axis 124 that may be substantially greater than the width. The first core 102a defines a cavity 120a along the longitudinal axis 124. The first core 102a has a first magnetic layer 106(a)(i) and a second magnetic layer 106(a)(ii) positioned substantially parallel to the first magnetic layer 106(a)(i). The magnetic layers 106a may be made of a first material having high magnetic permeability, low magnetic coercivity, and high saturation flux density. The first material may be CoNiFe, which has the foregoing advantageous characteristics. A first electrically insulating layer 108(a)(i) is positioned between the first magnetic layer 106(a)(i) and the second magnetic layer 106(a)(ii). The first electrically insulating layer 108(a)(i) is used to suppress a current (e.g., an eddy current) flowing between the first magnetic layer 106(a)(i) and the second magnetic layer 106(a)(ii). Each of the magnetic layers 106(a) may be electroplated as a conformal or continuous segment around the coil 104.

As shown in FIGS. 1 and 2, a plurality of electrically insulating layers 108a (including 108a(i), 108a(ii), etc.) are positioned alternatingly between a plurality of magnetic layers 106a (including 106a(i), 106a(ii), 106a(iii), etc.). In FIGS. 1 and 2, the portions labeled as "ALTERNATING MAGNETIC AND INSULATING LAYERS," refer to a plurality of electrically insulating layers 108a interleaved between the magnetic layers 106a. For clarity of illustration, only two layers 108a(i), 108a(ii) of the electrically insulating layers 108a are labeled on the drawings, and only layer 106a(i) of the plurality of magnetic layers 106a is labeled on the drawing.

The electrically insulating layers 108(a) interleaved between the magnetic layers 106a collectively form a continuous laminate having a plurality of alternating magnetic and insulating (non-conductive) layers. The electrically insulating layers 108a are formed of a material capable of enhancing magnetic characteristics of the first core 102a and electrically insulating adjacent magnetic layers 106a. The electrically insulating layers 108(a) may be made of an oxygen- and iron-containing material, for example, an iron oxide, FeO. Each electrically insulating layer 108(a) is preferably made of a Ferrite material. A ferrite material is preferred because it enhances the magnetic properties of the core unit 102, thereby improving the circuit electromagnetic performance by increasing, for example, the inductance. The electrically insulating layers 108(a) may be made of the same material or of different materials.

The electrically insulating layers 108(a) are aligned perpendicular to the direction of the eddy current flow, thereby significantly suppressing or eliminating eddy currents flowing between the plurality of magnetic layers 106(a). As a result, permeability and performance of the electromagnetic device 100 are optimized.

The magnetic layers 106(a) and the electrically insulating layers 108(a) in between the magnetic layers 106(a) are preferably formed as a single and substantially continuous segment. The magnetic layers 106(a) may be plated as a conformal or continuous segment around the coil 104 for providing a continuous closed-loop magnetic flux substantially free of bunching and spreading. This has a significant advantage over prior art cores that are formed with multiple components that may be coupled to one another. The single and substantially continuous core structure advantageously enhances the continuous closed-loop magnetic flux.

A semiconductor substrate 118 (for example, made of silicon) is positioned at least partially in the cavities 120a and 120b. The semiconductor substrate 118 has a first plurality of openings in which a coil 104 is positioned or embedded. The first plurality of openings have a high aspect ratio such that the openings for the coil 104 are tall and narrow. The core unit 102 and the coil 104 may be microfabricated for integration in an electronic circuit. The openings referenced with respect to the substrate may refer to molds, trenches, or etched regions, or any other types of openings in which an electromagnetic element such as the coil 104 may be positioned. The openings may be etched using via Deep Reactive-Ion (DRIE) etching, as discussed in further details below with respect to the method of manufacturing the electromagnetic device 100.

The coil 104 is made of an electrically conductive material such as copper. The coil 104 has a portion substantially parallel to the longitudinal axis 124. As shown in FIGS. 1 and 2, the coil 104 includes a plurality of secondary windings 104b that are interleaved between a plurality of primary windings 104a, thereby forming a portion of a transformer. The foregoing structure enables high current capacity and inductance, and significantly decreases parasitics between the primary windings 104a and the secondary windings 104b.

The interleaved primary and secondary windings 104a and 104b embedded in the substrate 118 may not have an electrical cross-over in-plane. Rather, the plurality of primary windings 104a may be formed as in-plane spiral connections and are connected in an out-of-plane section 114. Similarly, the plurality of secondary windings 104b can be connected out of plane. For illustration purposes, the out-of-plane connections are only shown on one side of the structure of FIG. 1. It can be appreciated that additional connections may be made, based on design concerns, for example, on the right out-of-plane region shown in FIG. 1.

An insulating material 112 may be positioned in the plurality of openings and between the substrate 118 and the coil 104. The insulating material 112 insulates the coil 104 from the substrate 118 and reduces stress from a thermal expansion mismatch between the coil 104 and the substrate 118. The insulating material 112 is an isolation material for reducing stress from thermal expansion. The insulating material 112 may be made of at least an organic material. The flexibility of the organic material advantageously reduces stress from thermal expansion. The insulating material 112 is preferably made of at least Parylene because Parylene forms as a conformal, continuous layer upon which the cores 102a and 102b can be formed. The insulating material 112 may have magnetic properties.

A metal seed layer (not shown) may be positioned underneath the magnetic layers 106a and 106b. The metal seed layer decreases the interface region thickness. Contacts of the metal seed layer 126 are shown in FIG. 1. The contacts may include wires for establishing an electrical connection. The contacts of the metal seed layer 126 are routed to an out-of-plane side 114 of the substrate 118, thereby enabling current flow for the plating process as discussed in further details below with respect to FIGS. 6, 7, 13 and 15-20.

The coil 104 and the core unit 102 may be micro-fabricated and integrated in circuitry. The micro-fabrication process may include continuous, single-segment electroplating. The continuous, single-segment structure of the electromagnetic device 100 advantageously enables a closed flux loop path substantially free of bunching and spreading. Due to reduced or eliminated flux leakage, parasitic inductance is significantly reduced or eliminated. The continuous, single-segment structure may be formed by electroplating, as set forth in further details below with respect to the method of manufacturing the electromagnetic elements. The electromagnetic elements can be single-shot plated to achieve the continuity and reduce manufacturing costs. Plating the core around the windings provides a continuous core roughly parallel to the direction of the magnetic flux.

The coil 104 and the core unit 102 may be integrated in an amplitude or power envelope tracking circuitry in which bias voltage is dynamically adjusted. The magnetic structure performs optimally when utilized in envelope tracking circuitry due to the favorable fast transient response. The transient response time may be less than 100 micro seconds. Furthermore, the integrated magnetic elements advantageously enable a dc-dc conversion with high power density (greater than 500 W/in$^3$), efficiency (greater than 90%) and a very high switching frequency which may be above 100 MHz.

The coil 104 and the core unit 102 can be micro-fabricated and integrated in a power chip with a flyback transformer. The coil 104 and the core unit 102 can be integrated in a transformer characterized by 1-5 MHz frequency, 6-10 μH inductance, 50-100 nH parasitic inductance, ~2 A, 8 A current, 300 mW loss and 14 mm$^2$ footprint. The foregoing characteristics are provided as examples for illustrating the advantages and benefits of the present invention. The present invention, however, is not limited to such characteristics.

Although FIGS. 1 and 2 show a preferred geometry in which two cores 102a and 102b are utilized, other number of cores and different geometry may be utilized based on design concerns. In another embodiment, a single core may be provided with primary and secondary windings that are not interleaved, similar to a conventional transformer configuration. The embodiments of FIGS. 1 and 2 advantageously reduce parasitic inductance and power loss due to the interleaving structure of the primary and secondary windings, as compared with the conventional transformer configuration.

Figure 3B:
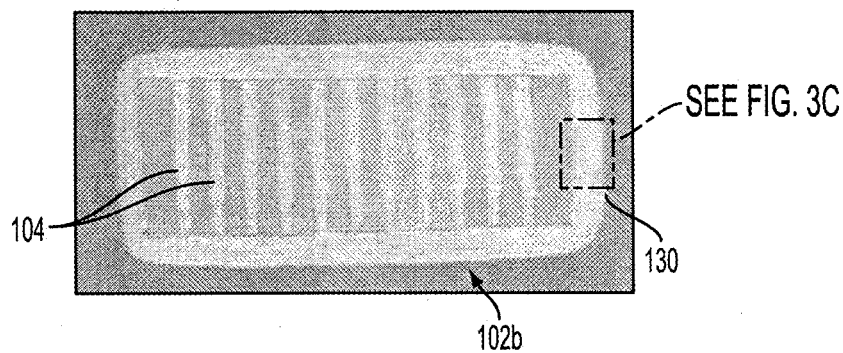
FIG. 3B is an SEM magnified cross-section image of the 3B-3B portion of the image shown in FIG. 3A according to an embodiment of the present invention.
Figure 3C:
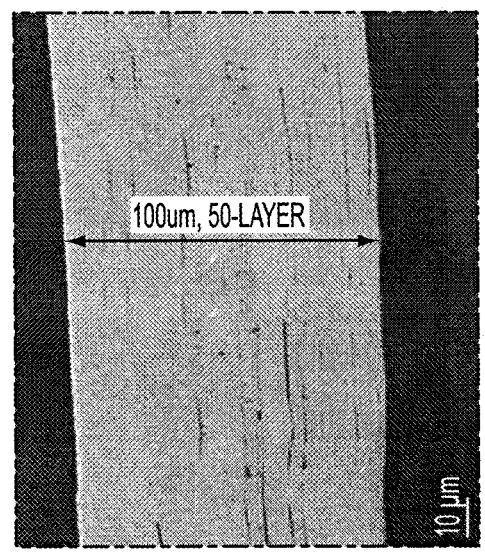
FIG. 3C is a magnified image of the SEM cross-section image shown in FIG. 3B according to an embodiment of the present invention.

FIG. 3A is an SEM top-view image of the coil 104 passing through cavities of two cores 102a and 102b. The coils 104 are formed similar to a racetrack and embedded in the substrate 118. The racetrack-shaped coil 104 has two arms 104c and 104d upon which the cores 102a and 102b are formed. FIG. 3B is an SEM magnified cross-section image of the 3B-3B portion of the image shown in FIG. 3A. The second core 102b is electroplated around the coil 104. FIG. 3C is a magnified image of section 130 shown in FIG. 3B. As can be seen in FIG. 3C, the magnetic layers 106b and electrically insulating layers 108b are formed as a 50-layer continuous, single-segment.

The multi-layer structure of the core 102 enables high-performance operation at high frequencies (for example, in MHz frequency range). 50 layers are shown as an exemplary embodiment; the number of layers can be predetermined based on design concerns. The continuity advantageously provides a closed magnetic flux path. Furthermore, the electrically insulating layers 108b are aligned perpendicular to the direction of the eddy current flow, thereby significantly suppressing or eliminating eddy currents flowing between the magnetic layers 106(a). As a result, permeability and performance of the electromagnetic device 100 are optimized.

Figure 4:
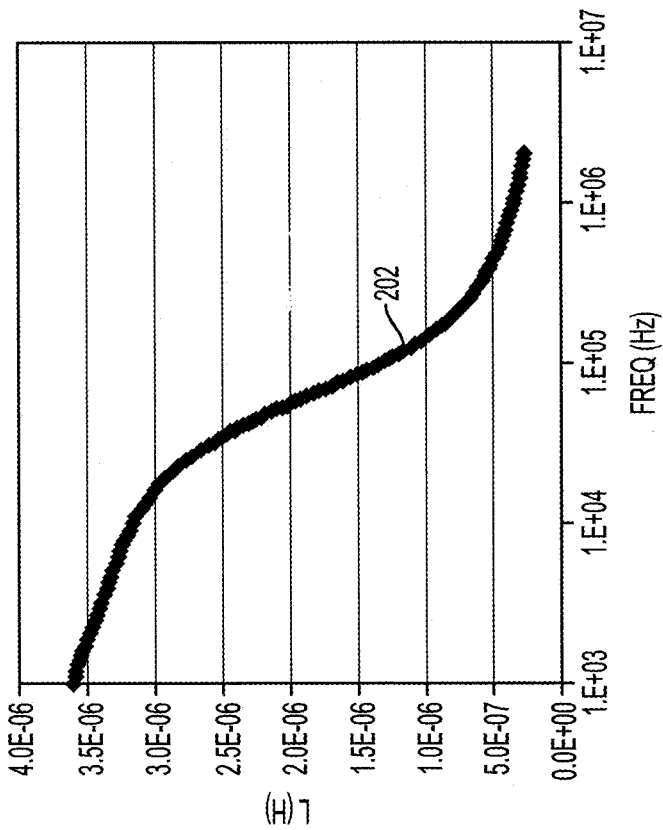
FIG. 4 is a graph plotting inductance of the primary coil of a transformer circuit over a range of frequencies according to an embodiment of the present invention.

FIG. 4 is a graph plotting inductance of the primary coil of a 5:1 transformer circuit over a range of frequencies. In embodiment 202, 50 continuous and conformal layers (having interleaved magnetic layers 106(a) and electrically insulating layers 108(a)) are formed in the core unit 102. It is ideal for the inductance to be high and remain constant when signal frequency is increased. As shown in FIG. 4, when the multi-layer continuous single-segment core is utilized, inductance is at a high value and remains stable at least from 1 kHz to 10 kHz.

Figure 5:
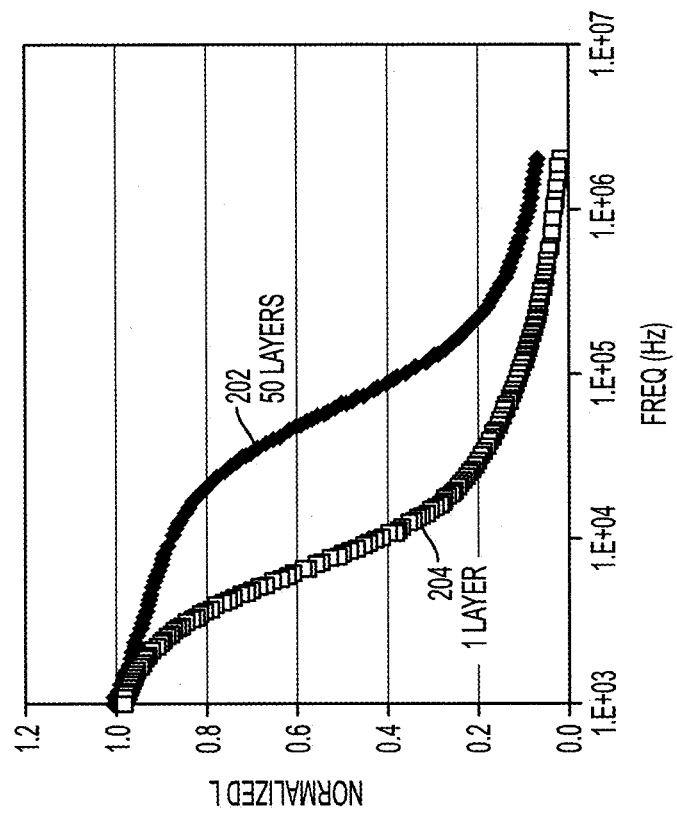
FIG. 5 is a graph plotting inductance of the primary coil of a transformer circuit according to an embodiment of the present invention and inductance of the primary coil of a transformer circuit known in the art.

FIG. 5 is a graph plotting normalized inductances of the primary coil of the transformer circuit according to the embodiment 202 of the present invention and an embodiment 204 known in the art. In the prior art embodiment 204, a single layer is utilized in the core. As can be seen in FIG. 5, the embodiment 202 maintains a high inductance over a higher range of frequencies, whereas the inductance of the embodiment 204 known in the art dramatically decreases between 1 kHz and 10 kHz. FIG. 5 shows that the present invention advantageously allows the microfabricated elements to perform optimally in high frequency applications.

The performance results shown in FIGS. 4 and 5 are disclosed for a particular embodiment for illustration purposes. The present invention is not limited to the performance characteristics shown in FIGS. 4 and 5. Improved performance can be achieved in accordance with the invention described herein, for example, depending on the number of layers and materials utilized.

Figure 6:
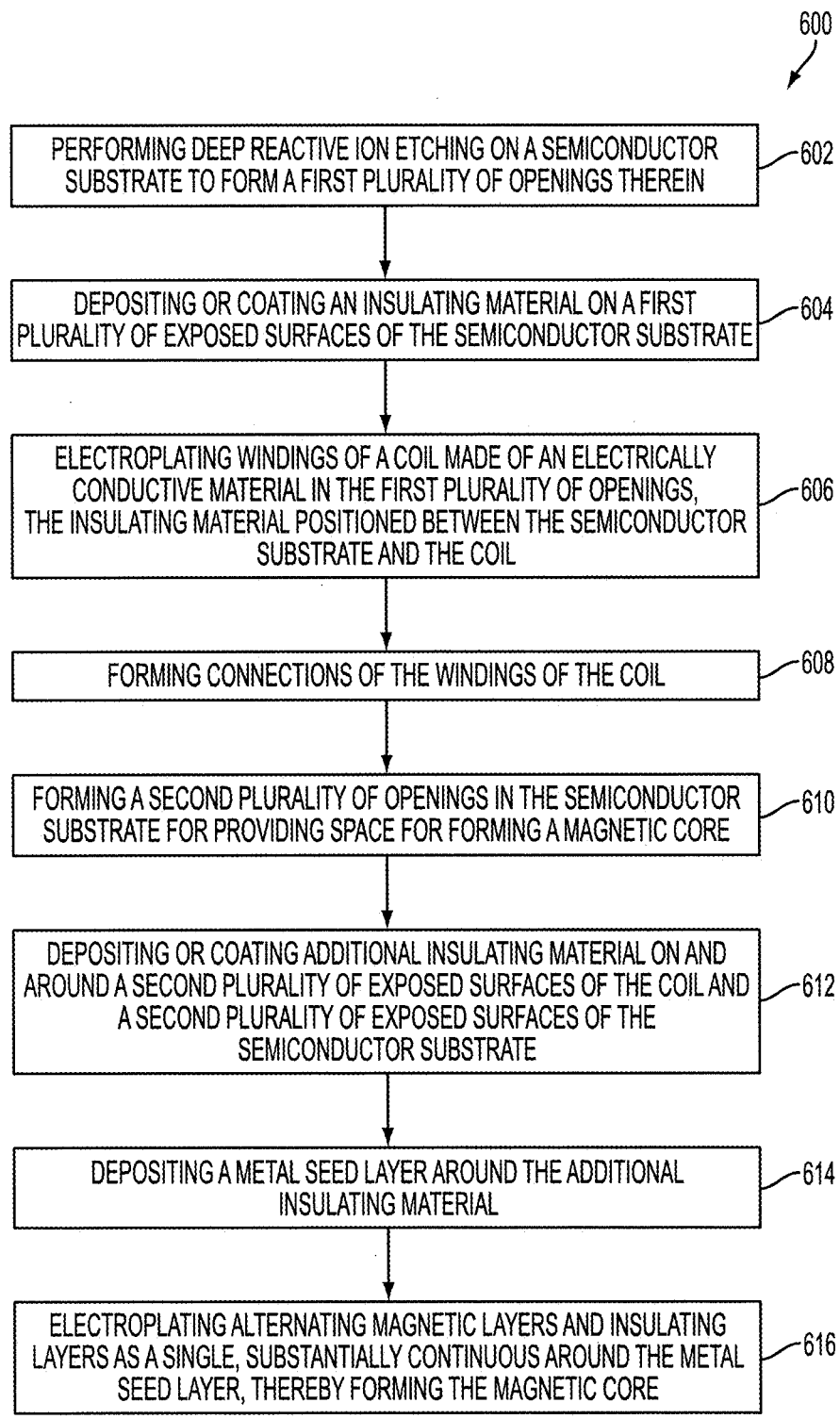
FIG. 6 is a flowchart diagram illustrating a method of manufacturing a core and a coil according to an embodiment of the present invention.

FIG. 6 is a flowchart diagram illustrating a method 600 of manufacturing a core 102a or 102b and a coil 104. Referring to step 602, the method 600 includes performing deep reactive ion etching (DRIE) on a semiconductor substrate to form a first plurality of openings therein. The first plurality of openings 111 may form molds for positioning windings of the coil 104. The DRIE process allows formation of the first plurality of openings with a high aspect ratio, which cannot be formed using conventional photoresist processes. The high aspect ratio allows dense packing of the copper windings. The aspect ratio may be substantially greater than 2 to 1. Furthermore, the high aspect ratio allows design of the thickness of the windings of the core 104 to minimize eddy current losses due to skin and proximity effects.

Referring to step 604, an insulating material 112 is deposited or coated on and around a first plurality of exposed surfaces of the semiconductor substrate 118. The insulating material 112 may provide isolation for reducing stress from thermal expansion. The insulating material 112 may be an organic material such as Parylene, as discussed above with respect to FIGS. 1 and 2.

Referring to step 606 of FIG. 6, windings of the coil 104 are electroplated in the first plurality of openings 111 of the semiconductor substrate 118 such that the insulating material 112 is positioned between the semiconductor substrate 118 and the coil 104. Although references to "electroplating" are made throughout the disclosure, other methods of plating may be utilized for formation of the coil 104 or the core unit 102, in order to form continuous and conformal layers. The embedded coil 104 is manufactured to have reduced resistive losses. As a result, an inlaid copper coil structure is formed in the semiconductor substrate 118, as shown for example in FIGS. 1, 2 and 8.

FIG. 8 is a cross-section schematic view of the resulting coil 104 embedded in the semiconductor substrate 118. As can be seen, the insulating material 112 is positioned between the semiconductor substrate 118 and the coil 104. As set forth above with respect to FIGS. 1 and 2, the insulating material 112 may be made of at least an organic material such as Parylene.

The active top portion 118a of the substrate 118 includes embedded coil 104, insulating material 112, and other circuit elements. During the fabrication process (for example, during etching), it is convenient to have a handling portion bonded to the active features on the active top portion 118a. The inactive bottom portion 118b may serve as a plating base for production of the coil 104. Because the inactive bottom portion 118b serves as a handling portion, it is optional and does not limit the scope of the present invention.

Referring to step 608 of FIG. 6, connections of the windings of the coil 104 can be formed. Cross-over connections can be formed in an out-of-plane section 114, as set forth above with respect to FIGS. 1 and 2, and as shown in FIG. 9.

FIG. 9 is a cross-section schematic view of connections added in an out-of-plane section 114. The connections of the out-of-plane section 114 are formed using patterned resist molding. For high-current applications, it is desirable for the connections to be formed as thick layers. As shown in FIG. 9, plating processes (such as electroplating) can be utilized to form the connections as a rather thick layer to support high currents. In other embodiments for other applications in which a thinner layer is sufficient, the connections can be formed using lift-off processes or depositing and etching processes.

Referring to step 610 of FIG. 6, a second plurality of openings 132 can be formed in the semiconductor substrate 118 for providing space for forming a magnetic core 102a or 102b.

FIG. 10 is a cross-section schematic view of partial formation of the second plurality of openings 132 in the semiconductor substrate 118 in order to provide space for forming the magnetic core 102a or 102b. The partial formation of the second plurality of openings 132 may be performed using front and back DRIE.

FIG. 11 is a cross-section schematic view of complete formation of the second plurality of openings 132 in the semiconductor substrate 118 in order to provide space for forming the magnetic core 102a or 102b. The complete formation of the second plurality of openings 132 may be performed using front and back wet and dry etching.

Referring to step 612 of FIG. 6, additional insulating material 112 is deposited or coated on and around a second plurality of exposed surfaces of the coil 104 and a second plurality of exposed surfaces of the semiconductor substrate 118. As a result, a middle isolated portion or a middle isolated portion 136 is formed. The middle isolated portion may refer to a micro-beam portion.

FIG. 12 is a cross-section schematic view of additional insulating material 112 formed on a middle isolated portion 136. The middle isolated portion 136 has the coil 104 embedded in the semiconductor substrate 118, and the additional insulating material 112 surrounds the middle isolated portion 136. The additional insulating material 112 is formed as a conformal and continuous layer around the middle isolated portion 136. The conformity is advantageous to allow formation of the metal seed layer 126 and the core 102a thereon, as described below.

Referring to step 614 of FIG. 6, a metal seed layer 126 is deposited around the additional insulating material 112. FIG. 13 is a cross-section schematic view of the metal seed layer 126 formed around the additional insulating material 112. A patterned metal seed layer 126 may be deposited by masked front and back physical vapor deposition (PVD). The PVD process may include front-side metallization and at least one back-side metallization in order to form a metal seed layer 126 that encompasses the additional insulating material 112. Exemplary processes for forming the metal seed layer 126 are described below with respect to FIGS. 15-20.

FIG. 15 is a cross-section schematic view of a semiconductor substrate 118 having a middle isolated portion 136 covered with an insulating material 112 and a coil embedded therein. FIG. 16 is a cross-section schematic view of a front-side metallization process with a front-side deposition angle 140 for formation of a front-side metal seed layer on at least the front side of the middle isolated portion (or micro-beam portion) 136. The middle isolated portion 136 may be a micro-beam that is suspended. The middle isolated portion 136 can be tied to the substrate 118, for example, by clamping it to the substrate 118 at two sides of the middle isolated portion 136. The front-side metallization process is performed using a shadow mask 142 positioned substantially parallel to the semiconductor substrate 118.

FIG. 17 is a cross-section schematic view of a front-side metal seed layer 126a formed after performing the front-side metallization process of FIG. 16. FIG. 18 is a cross-section schematic view of a first back-side metallization process with a back-side deposition angle 144. As can be seen in FIG. 18, the combination of the semiconductor substrate 118 and the shadow mask 142 is tilted with respect to the back-side deposition angle 144, in order to metalize the first lateral metal seed layer 126b.

FIG. 19 is a cross-section schematic view of a second back-side metallization process for formation of a metal seed layer. Before the second back-side metallization process, it can be seen that the back-side metal seed layer 126c and the first lateral metal seed layer 126b are formed. After the second back-side metallization process, a second lateral metal seed layer 126d opposite the first lateral metal seed layer 126b is formed. The second lateral metal seed layer 126d is formed due to the combination of the semiconductor substrate 118 and the shadow mask 142 being tilted with respect to the deposition angle 146.

FIG. 20 is a cross-section schematic view of a metal seed layer 126 formed after performing the front-side and back-side metallization processes of FIGS. 16, 18 and 19. As a result, the metal seed layer 126 has four sides 126a-d that encompass the additional insulating material 112.

Figure 21A:
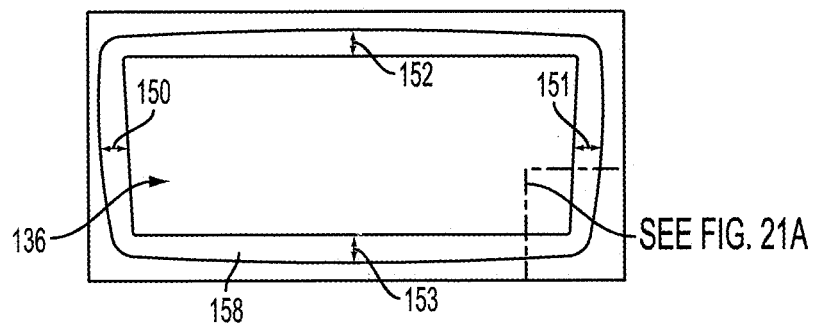
FIG. 21A is a cross section view image of a metal seed layer formed around a middle isolated portion of a semiconductor substrate according to an embodiment of the present invention.
Figure 21B:
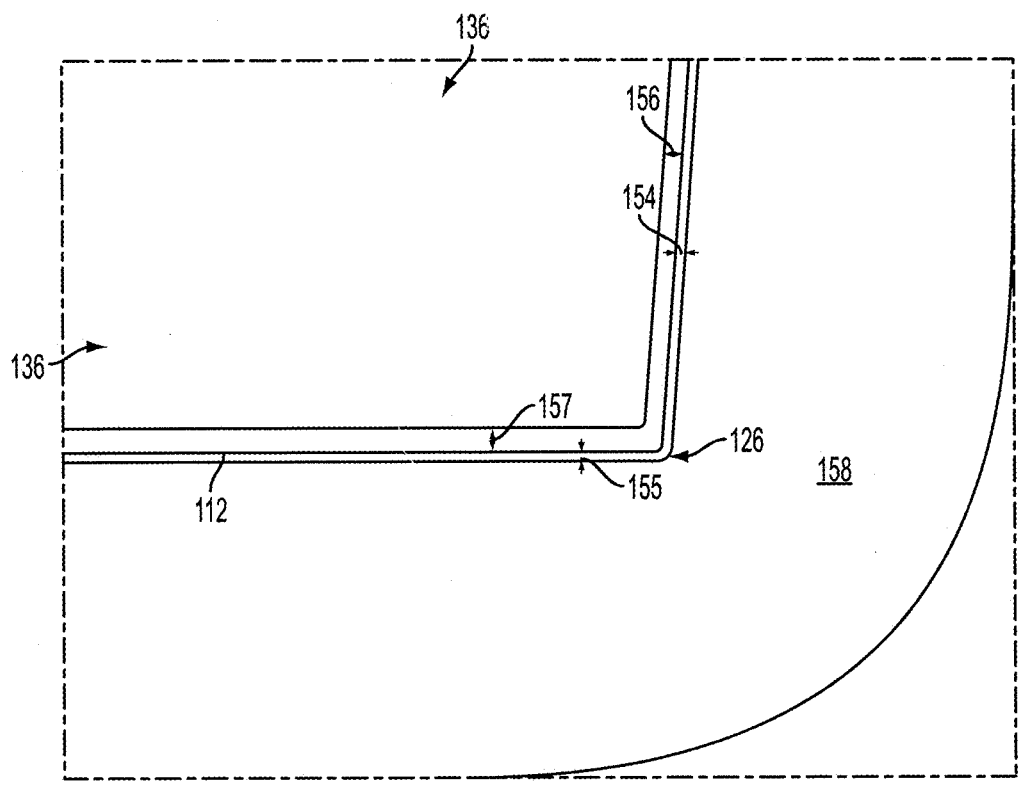
FIG. 21B is a magnified view of FIG. 21A, showing an insulating material formed between the middle isolated portion of the semiconductor substrate and the metal seed layer according to an embodiment of the present invention.

FIG. 21A is a cross section view image of the metal seed layer 126 and a magnetic plating portion 158. FIG. 21B is a magnified view of the cross section image of FIG. 21A, showing an insulating material formed between the middle isolated portion (or micro-beam portion) 136 and the metal seed layer 126. A magnetic plating portion 158 for the electroplating process may be positioned around the metal seed layer 126. For example, the magnetic plating portion 158 may be formed of at least one of copper, cobalt, nickel, or iron. As can be seen in FIG. 21A, the magnetic plating portion covers a larger area than the middle isolated portion 136. The dimensions 150, 151, 152 and 153 may be around 61, 65, 59 and 64 micro meters, respectively.

The metal seed layer 126 is formed continuously over all four sides of the middle isolated portion 136. The metal seed layer 126 is formed such that it is not too thick to minimize adverse magnetic or current loss effects of the metal seed layer 126. For example, the thickness of the metal seed layer 126 can be around 2 micro meters. As shown in FIGS. 21A and 21B, the dimensions 154 and 155 may be around 3 micro meters. The thicknesses 156 and 157 of the insulating material 112 may be around 4 micro meters. An electrical connection (for example, a wire) can be made between the metal seed layer 126 to a portion or an edge of the semiconductor substrate 118 in order to allow electroplating. After the plating process, such electrical connection between the metal seed layer 126 and the side of the semiconductor substrate 118 is no longer needed.

Referring to step 616 of FIG. 6, alternating magnetic layers 106a and electrically insulating layers 108a are deposited around the coil 104, as a single, substantially continuous segment around the metal seed layer 126. The alternating magnetic layers 106a and electrically insulating layers 108a form a core 102a or 102b. In the electroplating process, successive layers are formed by passing currents through the laminate. Electroplating advantageously allows creation of continuous, alternating magnetic layers 106a and electrically insulating layers 108a, which could not be achieved using common methods such as sequential sputtering. Step 616 may be performed using single-shot electroplating. The single-shot electroplating process is faster and performed at a lower cost, as compared with other processes (such as sputtering or evaporation). FIG. 14 is a cross-section schematic view of a plurality of continuous magnetic and electrically insulating layers 106(a) and 108(a) plated around the metal seed layer 126 of FIG. 13. It can be appreciated that a second core can be fabricated using a similar process to form the structure shown in FIGS. 1 and 2.

Figure 7:
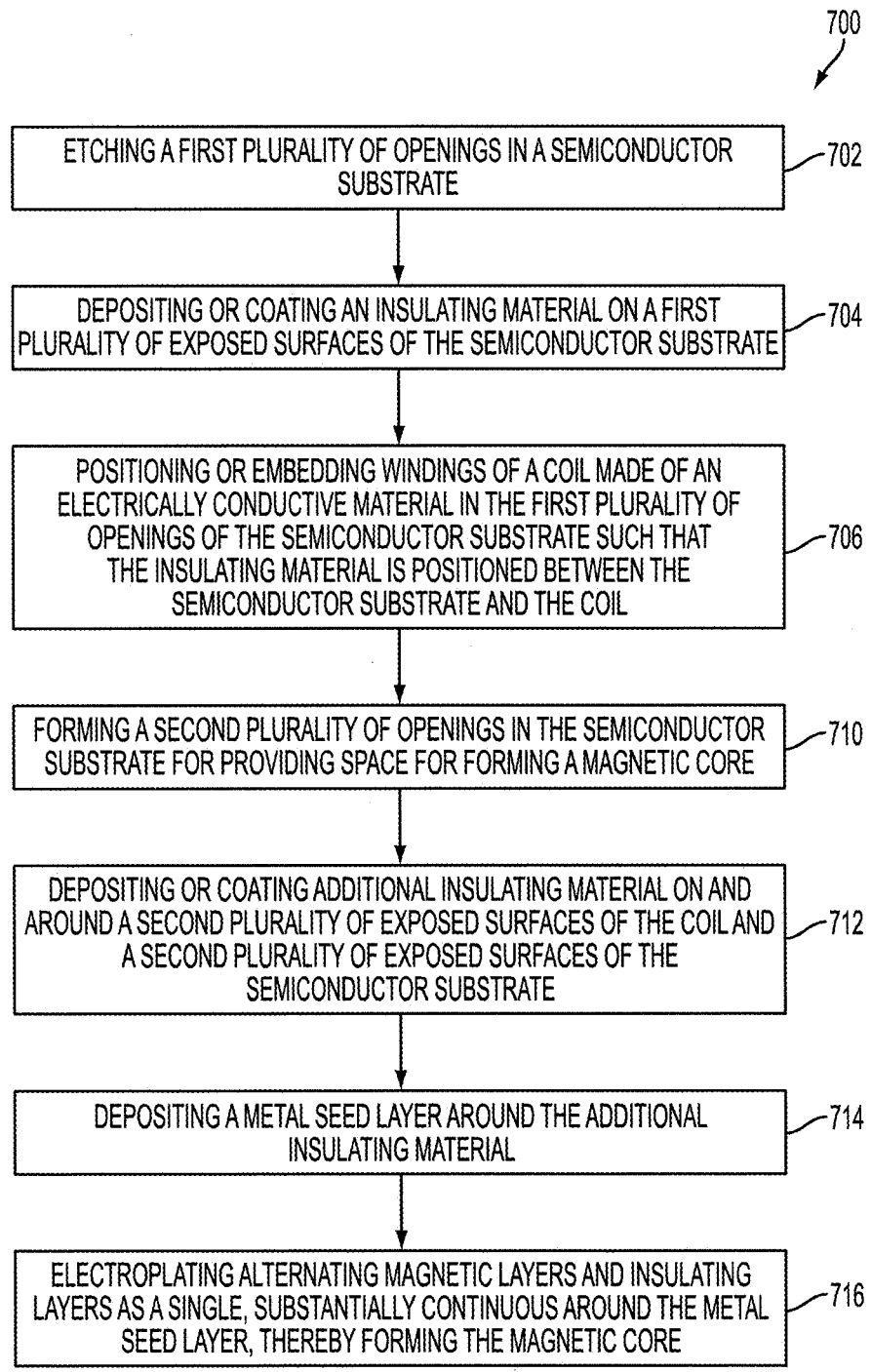
FIG. 7 is a flowchart diagram illustrating a method of manufacturing a core and a coil according to an embodiment of the present invention.

FIG. 7 is a flowchart diagram illustrating a method 700 of manufacturing a core unit 102 and a coil 104. In step 702, a first plurality of openings 111 are etched in the semiconductor substrate 118, for example, using the process set forth with respect to step 602 of FIG. 6. In step 704, an insulating material is deposited on a first plurality of exposed surfaces of the semiconductor substrate 118. In step 706, windings of a coil 104 made of an electrically conductive material are positioned or embedded in the first plurality of openings 111 of the semiconductor substrate 118 such that the insulating material 112 is positioned between the semiconductor substrate 118 and the coil 104. The windings of the coil 104 may be electroplated as discussed above with respect to step 606 of FIG. 6. In step 710, a second plurality of openings 132 are formed in the semiconductor substrate 118 for providing space for forming a magnetic core 102a or 102b, as set forth above with respect to step 610 of FIG. 6.

In step 712 of FIG. 7, additional insulating material 112 are deposited or coated on and around a second plurality of exposed surfaces of the coil 104 and a second plurality of exposed surfaces of the semiconductor substrate 118, for example, as set forth above with respect to step 612 of FIG. 6. In step 714, a metal seed layer 126 is deposited on the additional insulating material 112, as described with respect to FIGS. 6, 13 and 15-20. In step 716, alternating magnetic layers 106a and electrically insulating layers 108a are deposited around the coil 104, as a single, substantially continuous segment around the metal seed layer 126, as discussed above with respect to FIGS. 1-3C, 6 and 14. Referring to FIGS. 6 and 7, additional intermediate steps for fabricating the coil 104 and the core unit 102 may be performed.

The present invention advantageously allows micro-fabrication of high frequency integrated magnetics. The electroplated magnetic materials advantageously have high permeability, low coercivity, and high saturation flux density. The micro-fabricated core includes electrically insulating layers that eliminate eddy current losses while enabling magnetic coupling for increased permeability. Furthermore, the coil 104 is micro-fabricated and exhibits low parasitics. The present invention provides design flexibility in that thickness of the windings can be predetermined to minimize or eliminate eddy currents. Furthermore, the present invention enables fabrication of high-aspect ratio plated features that cannot be achieved using conventional methods such as photoresist etching. The foregoing structure of the coil 104 and the core unit 102 is advantageous because it is low cost and ideal for on-chip integration. The foregoing electromagnetic device structure advantageously provides a continuous plated structure that has a closed loop flux path, reduced parasitic inductance, high power density, efficiency, and favorable transient response.

Exemplary implementations of the disclosure have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such implementations that reasonably fall within the scope of the advancement to the art hereby contributed, and that that scope shall not be restricted, except in light of the appended claims and their equivalents.

The invention claimed is:

1. An electromagnetic device comprising:
   a core having a width and a length along a longitudinal axis, the core defining a cavity along the longitudinal axis, and including:
   a first magnetic layer,
   a second magnetic layer positioned substantially parallel to the first magnetic layer, and
   an electrically insulating layer positioned between the first magnetic layer and the second magnetic layer for suppressing a current flowing between the first magnetic layer and the second magnetic layer, each of the first magnetic layer and the second magnetic layer formed as a single and continuous segment for providing a continuous closed-loop magnetic flux free of flux bunching and spreading;
   a semiconductor substrate positioned at least partially in the cavity and having a plurality of openings; and
   a coil made of an electrically conductive material and positioned or embedded in the plurality of openings of the semiconductor substrate, the coil having a portion that is substantially parallel to the longitudinal axis.

2. The electromagnetic device of claim 1, wherein the core and the coil are micro-fabricated for integration in an electronic circuit.

3. The electromagnetic device of claim 1, wherein each of the first magnetic layer and the second magnetic layer of the core is plated as a conformal or continuous segment around the coil for enhancing the continuous closed-loop magnetic flux.

4. The electromagnetic device of claim 1, further comprising a second core having a width and a length along the longitudinal axis, the second core defining a second cavity along the longitudinal axis, and including:
   a third magnetic layer,
   a fourth magnetic layer positioned substantially parallel to the third magnetic layer, and
   a second electrically insulating layer positioned between the third magnetic layer and the fourth magnetic layer for suppressing a current flowing between the third magnetic layer and the fourth magnetic layer, each of the third magnetic layer and the fourth magnetic layer being formed as a single and continuous segment for enhancing the continuous closed-loop magnetic flux.

5. The electromagnetic device of claim 4, wherein at least a second portion of the coil is substantially parallel to the longitudinal axis and passes through the second cavity, and the coil includes a plurality of secondary windings that are interleaved between a plurality of primary windings, thereby forming a portion of a transformer.

6. The electromagnetic device of claim 4, further comprising a second coil separated from the coil, at least a portion of the second coil passing through the second cavity, and the coil includes a plurality of secondary windings that are interleaved between a plurality of primary windings, thereby forming a transformer.

7. The electromagnetic device of claim 1, wherein the plurality of openings of the semiconductor substrate has an aspect ratio that is greater than 2 to 1.

8. The electromagnetic device of claim 1, wherein the first magnetic layer and the second magnetic layer of the core are made of a first material having high magnetic permeability and low magnetic coercivity, and
   wherein the electrically insulating layer of the core is formed of a material capable of enhancing magnetic characteristics of the core and electrically insulating the first magnetic layer of the core from the second magnetic layer of the core to reduce an eddy current and power loss.

9. The electromagnetic device of claim 1, wherein the first magnetic layer and the second magnetic layer of the core are made of at least CoNiFe, and the electrically insulating layer is made of a Ferrite material.

10. The electromagnetic device of claim 1, further comprising an insulating material positioned in the plurality of openings, and between the semiconductor substrate and the coil, for insulating the coil from the semiconductor substrate and for reducing stress from a thermal expansion mismatch between the coil and the semiconductor substrate.

11. The electromagnetic device of claim 10, wherein the insulating material is made of at least an organic material capable of reducing the stress from the thermal expansion mismatch between the coil and the semiconductor substrate.

12. The electromagnetic device of claim 10, wherein the insulating material is made of at least Parylene.

13. The electromagnetic device of claim 1, wherein the coil includes a plurality of primary windings and a plurality of secondary windings.

14. A micro-fabricated electromagnetic device integrated in an electronic circuit, the micro-fabricated electromagnetic device comprising:
   a core having a width and a length along a longitudinal axis that is substantially greater than the width, the core defining a cavity along the longitudinal axis, and including:
      a plurality of magnetic layers extending parallel to the longitudinal axis and surrounding the cavity, each of the plurality of magnetic layers being formed as a single and continuous segment for providing a continuous closed-loop magnetic flux substantially free of flux bunching and spreading, and
      a plurality of electrically insulating layers positioned alternatingly between the plurality of magnetic layers, collectively forming a continuous laminate having a plurality of alternating magnetic and electrically insulating layers, the plurality of electrically insulating layers suppressing a current flowing between the plurality of magnetic layers;
   a semiconductor substrate positioned at least partially in the cavity and having a plurality of openings;
   a coil formed of an electrically conductive material and embedded in the plurality of openings of the semiconductor substrate, the coil having a portion substantially parallel to the longitudinal axis and positioned in the cavity; and
   an insulating material positioned in the cavity and between the coil and an inner surface of the core for electrically insulating the core from the coil and reducing stress from a thermal expansion mismatch between the coil and the core.

15. The micro-fabricated electromagnetic device of claim 14, further comprising a second core having a width and a length along the longitudinal axis that is substantially greater than the width of the second core, the second core defining a second cavity along the longitudinal axis, and including:
   a second plurality of magnetic layers extending parallel to the longitudinal axis and surrounding the second cavity, each of the second plurality of magnetic layers being formed as a single and continuous segment, and
   a second plurality of electrically insulating layers positioned alternatingly between the second plurality of magnetic layers for suppressing the current flowing between the second plurality of magnetic layers, and collectively forming a continuous laminate having a second plurality of alternating magnetic and electrically insulating layers,
   wherein at least a second portion of the coil is substantially parallel to the longitudinal axis and passes through the second cavity.

16. The micro-fabricated electromagnetic device of claim 14, wherein the plurality of magnetic layers are made of a first material having high magnetic permeability and low magnetic coercivity, and the plurality of electrically insulating layers are formed of a ferrite material for reducing an eddy current between the plurality of magnetic layers and for reducing power loss.

* * * * *